(12) United States Patent
Booij et al.

(10) Patent No.: US 6,931,041 B2
(45) Date of Patent: Aug. 16, 2005

(54) INTEGRATED SEMICONDUCTOR LASER DEVICE AND METHOD OF MANUFACTURE THEREOF

(75) Inventors: Wilfred Booij, Cambridge (GB); Mark Silver, Ipswich (GB); Graham Michael Berry, Bury St. Edmunds (GB)

(73) Assignee: Agilent Technologies, Inc., Palo Alto, CA (US)

( * ) Notice: Subject to any disclaimer, the term of this patent is extended or adjusted under 35 U.S.C. 154(b) by 239 days.

(21) Appl. No.: 10/459,717

(22) Filed: Jun. 12, 2003

(65) Prior Publication Data

US 2004/0057646 A1 Mar. 25, 2004

(30) Foreign Application Priority Data

Jun. 12, 2002 (EP) .............................. 02254069

(51) Int. Cl.[7] ................................. H01S 3/14
(52) U.S. Cl. .............................. 372/39; 372/45; 372/50
(58) Field of Search ............................. 372/39, 43–50, 372/11, 26; 257/79, 94, 98, 184, 431

(56) References Cited

U.S. PATENT DOCUMENTS

| | | | |
|---|---|---|---|
| 4,759,023 A | * | 7/1988 | Yamaguchi ................. 438/23 |
| 5,717,710 A | | 2/1998 | Miyazaki et al. |
| 5,901,265 A | | 5/1999 | Tohyama et al. |
| 6,021,148 A | | 2/2000 | Matsumoto et al. |
| 6,246,709 B1 | | 6/2001 | Oshiba et al. |
| 6,360,048 B1 | * | 3/2002 | Yamada ....................... 385/131 |
| 6,509,580 B2 | * | 1/2003 | Charles ....................... 257/27 |
| 6,678,299 B1 | * | 1/2004 | Inaba et al. ................... 372/45 |
| 6,813,068 B2 | * | 11/2004 | Hamamoto ................. 359/344 |

FOREIGN PATENT DOCUMENTS

EP        0700136        3/1996

* cited by examiner

*Primary Examiner*—Minsun Oh Harvey
*Assistant Examiner*—Delma R. Flores-Ruiz

(57) ABSTRACT

An integrated buried heterojunction laser optically coupled to a ridge waveguide electro-absorption (EA) optical modulator having a raised ridge structure is manufactured on a single semiconductor substrate on which a plurality of semiconductor layers are grown, including at least one active layer through which optical radiation is coupled from the laser to the waveguide. Semiconductor layers above the active layer form a laser current conduction region and semiconductor layers adjacent the active layer form a laser current confinement region. The ridge structure is formed from one or more layers also used to form the laser current conduction region. The layers used to form the laser current confinement region do not extend adjacent the ridge structure.

17 Claims, 4 Drawing Sheets

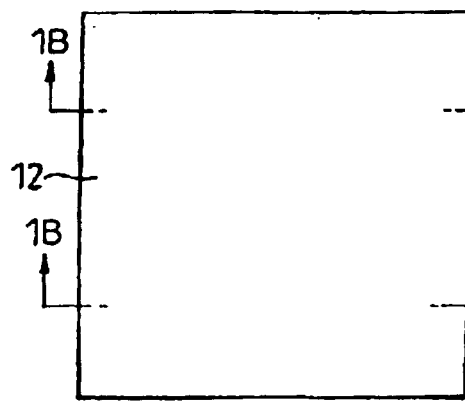
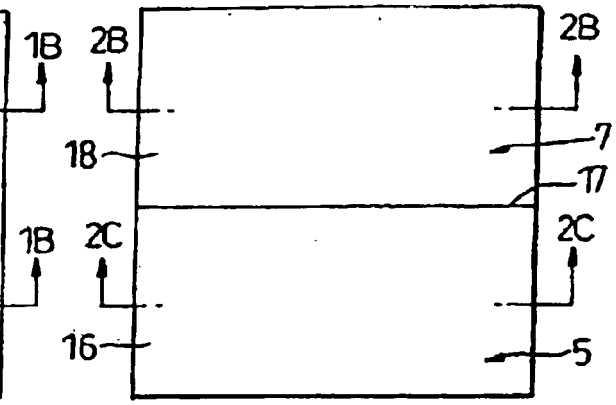
Fig. 1A          Fig. 2A
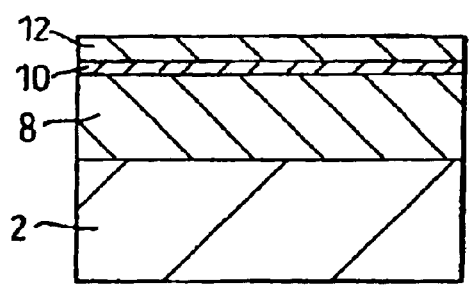
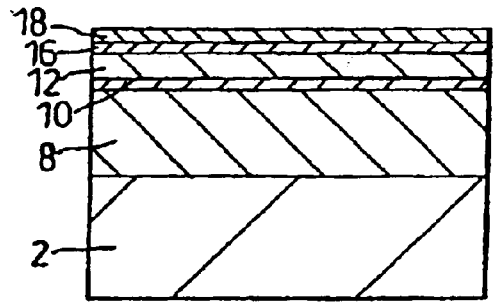
Fig. 1B          Fig. 2B
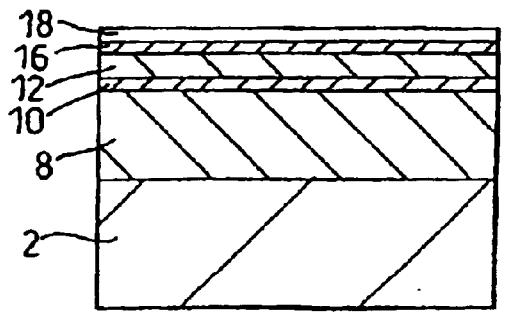
Fig. 2C

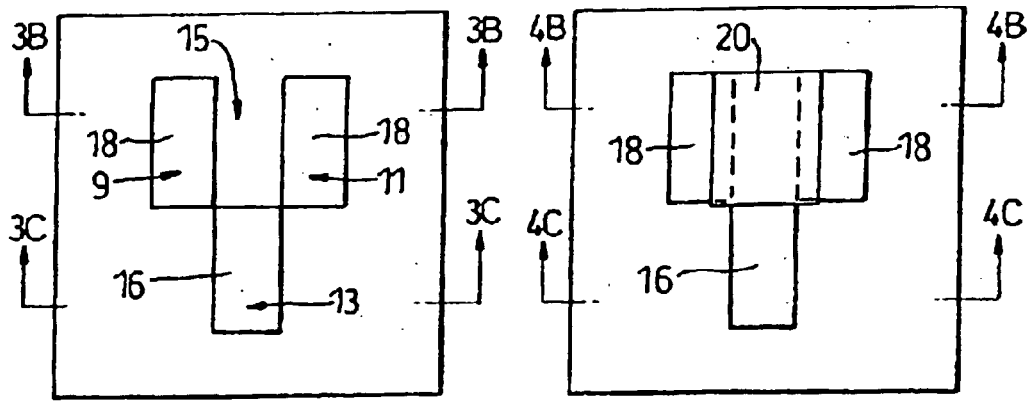
*Fig. 3A*      *Fig. 4A*
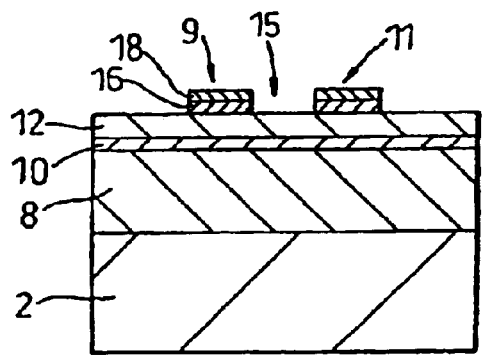 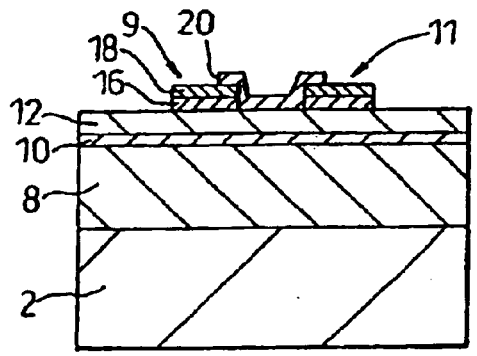
*Fig. 3B*      *Fig. 4B*
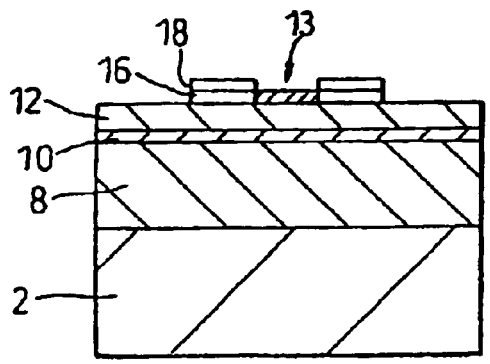 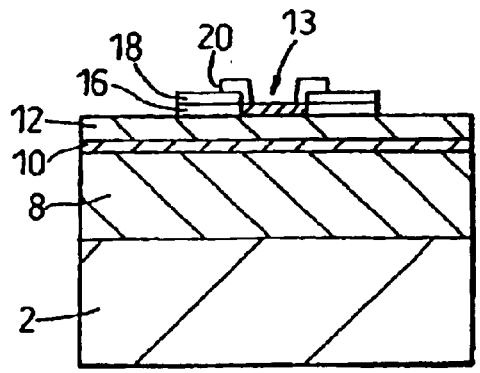
*Fig. 3C*      *Fig. 4C*

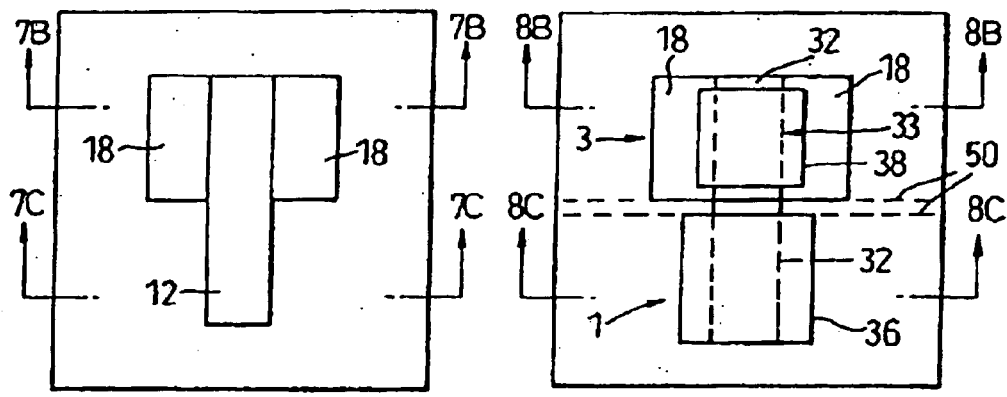
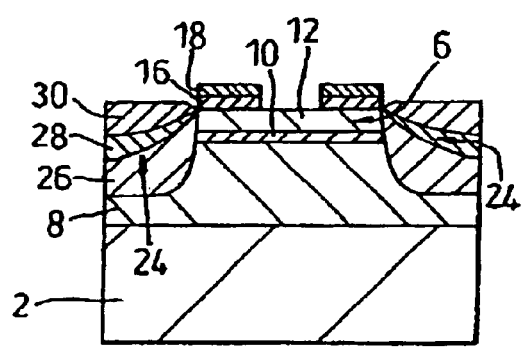
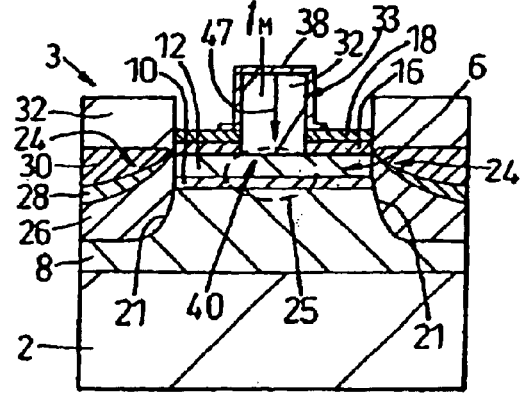
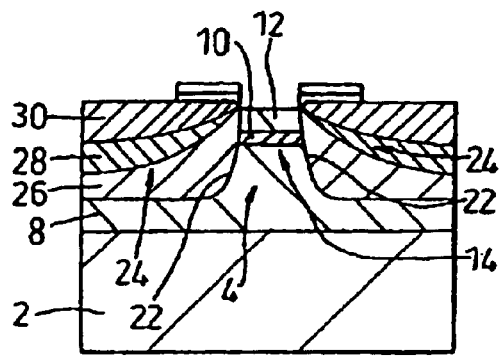
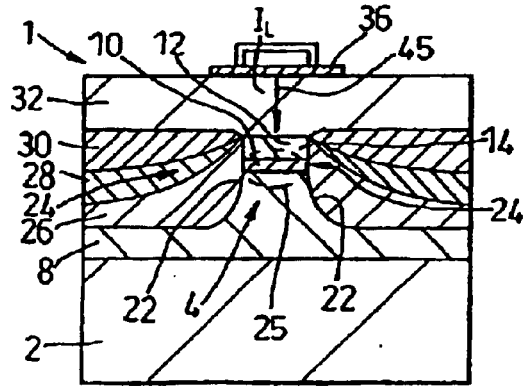
*Fig. 7A*  *Fig. 8A*  *Fig. 7B*  *Fig. 8B*  *Fig. 7C*  *Fig. 8C*

INTEGRATED SEMICONDUCTOR LASER DEVICE AND METHOD OF MANUFACTURE THEREOF

BACKGROUND OF THE INVENTION

1. Field of the Invention

The present invention relates to an integrated semiconductor device and a method of manufacture thereof, and more particularly, the present invention relates to a buried heterojunction laser that is optically coupled to a ridge waveguide electro-absorption (EA) optical modulator and a method of manufacture thereof.

2. Description of the Related Art

It is known to fabricate an integrated semiconductor device having a laser and a waveguide EA modulator using a unitary III–V semiconductor substrate. The modulator can be formed either using a ridge waveguide or a buried mesa waveguide. The optical radiation output from the laser, for example, visible or infrared radiation, can then be coupled optically to the EA modulator, which is then used to high frequency modulate the optical radiation generated by the laser. Fabricating a laser and waveguide device on the same substrate gives significant advantages in terms of ensuring alignment between the laser and waveguide components of the device. The components can then use the same epitaxially grown current confinement layers, which helps to simplify the manufacturing process.

In the field of transmitter devices for fiber-optic communication, operation is required at optical wavelengths ranging from 1.3 to 1.6 $\mu$m. Such opto-electronic transmitter devices are therefore usually fabricated from a wafer grown from an n-InP substrate on which are grown a number of layers, including an undoped InGaAsP active layer, which can be either a bulk semiconductor or a multiple quantum well or dot structure sandwiched between an upper p-InP cladding layer and a lower n-InP buffer layer. A mask is applied to the upper cladding layer, and the surrounding layers are etched to leave a mesa structure. Buried heterostructure light emitting devices commonly have current confinement regions defined by areas of high resistivity to limit current flow. Such regions are grown to cover the sides of the mesa and to channel current to an optically active layer within the mesa structure.

A mask defining the mesa is then removed, and further layers are grown up to a $p^+$-InGaAs ternary cap layer. The ternary cap layer has a relatively low resistance and narrow bandgap facilitating electrical contact, and so serves as a contact layer to which electrical contacts can be made.

In devices using InGaAsP/InP materials, current confinement regions have often been employed based on a reverse-biased p-n or n-p diode structure. Such structures provide high resistance to current flow, and low leakage currents. These devices can also be directly modulated, and are widely used in fiber optic communication systems across a range of operating temperatures and at frequencies up to about 2.5 GHz.

In recent years there has been an increasing demand for fiber optic communication links having a bandwidth in excess of 2.5 GHz, for example up to at least 10 GHz. EA modulators can be used to achieve higher operating frequencies, but further limitations to operating frequency arise when an EA modulator is formed with the laser on the same substrate using the same current confinement structure. At operating frequencies above 2.5 GHz, the performance of EA devices becomes limited by the capacitance of the blocking structures used by lasers to achieve good current blocking performance. A lower capacitance structure that permits the EA modulator to operate at a high frequency can have poorer current blocking performance or lead to higher threshold currents in the laser section. It can be possible to limit such temperature changes by the use of a thermo-electric cooler, but this adds to the complexity, power budget, and cost of the device.

SUMMARY OF THE INVENTION

It is an object of the present invention to provide a semiconductor device and method of manufacture thereof that addresses these issues.

A semiconductor device according to an embodiment of the present invention comprises a semiconductor substrate and a plurality of semiconductor layers grown over the substrate, wherein:

the layers include at least one active layer and form a plurality of integrated optical components, the components including a buried heterojunction laser and a ridge waveguide having an optically guiding ridge structure, the ridge waveguide being optically coupled via the active layer to receive laser radiation generated by the laser;

the layers above the active layer form a laser current conduction region and form a laser current confinement region adjacent the active layer of the laser, the laser current conduction region and laser current confinement region being arranged to channel electric current to the active layer of the laser;

the ridge structure is formed from one or more layers also used to form the laser current conduction region; and the layers used to form the laser current confinement region do not extend adjacent the ridge structure.

A method of manufacturing a semiconductor device according to an embodiment of the present invention comprises:

depositing a plurality of semiconductor layers including an active layer over a semiconductor substrate over to form a plurality of integrated optical components, the integrated optical components including a buried heterojunction laser and a ridge waveguide, the ridge waveguide being optically coupled via the active layer to receive laser radiation generated by the laser;

manufacturing the laser and ridge waveguide from the semiconductor layers by:

i) forming at least one active layer;

ii) forming a laser current conduction region that extends above the at least one active layer;

iii) forming a laser current confinement region adjacent the active layer of the laser, the laser current conduction region and laser current confinement region being arranged to channel electric current to the active layer of the laser; and iv) forming an optically guiding ridge structure comprising one or more of the semiconductor layers that also form the laser current conduction region;

wherein the laser current confinement region does not extend adjacent the ridge structure.

By forming the device from a substrate that is common to both the laser component and the waveguide component, it is possible to maintain the inherent advantages of an integrated device, while at the same time forming the laser current confinement region to not extend adjacent the ridge structure. This separates the waveguide from potentially adverse capacitive effects from the current confinement region. It is then possible to optimize the performance of the current confinement region solely with respect to the requirements of the laser component. For example, the laser current confinement region can include one or more reverse biased p-n junctions or n-p junctions, which have good current blocking properties, but which can have excessive capacitance for high frequency operation of an EA modulator.

In a preferred embodiment of the invention, the ridge waveguide is an opto-electronic modulator, for example, an electro-absorption (EA) modulator, for modulating the optical radiation generated by the laser.

The integrated nature of the device allows for the use of process steps that are common between the various components. For example, the laser conduction region and the ridge structure can be formed from the deposition of one or more of the same semiconductor layers. The layers that form the laser current conduction region can then also form a waveguide current conduction region to channel electric current to the active layer of the waveguide.

In a preferred embodiment of the invention, step i) includes the formation in the buried heterojunction laser of a first mesa structure and step iv) includes the formation in the ridge waveguide of a second mesa structure, the mesa structures being created by the concurrent deposition of a plurality of semiconductor layers, the deposited layers being common to both the laser and ridge waveguide. Concurrent etching of the common layers follows the deposition of the semiconductor layers to form the mesas.

Therefore, if the buried heterojunction laser includes a first buried mesa structure flanked by the laser current confinement region, the ridge waveguide mesa can be flanked by the same semiconductor layers that form the laser current confinement region. The ridge waveguide can also have a ridge structure that rises above the second mesa, in which case, the second mesa can have a plateau that separates the ridge structure from those same semiconductor layers that form the current confinement region. This permits the use of a raised ridge structure, which in a waveguide will generally have superior optical performance to a fully buried waveguide structure.

If the ridge structure has an adjacent plateau, this plateau can be covered with an insulating layer that extends from the ridge structure towards those same semiconductor layers used to form the laser current confinement region. The insulating layer is preferably a glass-like layer, for example, being formed from silicon oxide and/or silicon nitride.

One or more electric contact layers can then be deposited over the laser current conduction region and/or the waveguide current conduction region. At least one of these electrical contact layers can be used to provide an electrical contact for supplying electric current to the ridge structure.

In a preferred embodiment of the invention, the ridge structure is overlain by an electrical contact layer that extends over sides of the ridge structure and partially over the insulating layer that covers the plateau. This makes it easier to apply such a contact layer, for example, by vacuum deposition of a metallic layer, because it is not necessary to achieve an exact alignment between the top of the ridge structure and the contact layer.

A method of forming an integrated semiconductor device having a laser and a ridge waveguide in accordance with a preferred embodiment of present the invention comprises:

a) depositing a plurality of semiconductor layers including an active layer on a substrate;

b) depositing a first mask material over a first area of the semiconductor layers deposited in step a) and depositing a second mask material over a second area of the semiconductor layers deposited in step a);

c) patterning both the first mask material and the second mask material in a patterning process common to both the first area and the second area to form a first mask in the first area and a second mask in the second area, the first mask comprising a block of the first mask material, and the second mask comprising a pair of blocks of the second mask material, the pair of blocks of the second mask material defining an unmasked gap therebetween and the unmasked gap being in alignment with and adjacent to the block of the first mask material;

d) covering the gap between the pair of blocks of the second mask material with a third mask;

e) etching the deposited semiconductor layers around a periphery of the first mask, second mask and third mask to create a first mesa under the first mask and a second mesa under the second and third masks;

f) depositing a plurality of semiconductor layers adjacent the first mesa and the second mesa to create a laser current confinement region;

g) removing the first and third masks; and h) depositing at least one semiconductor layer over the exposed areas of the mesas apart from the area of the second mesa covered by the second mask to form a laser current conduction region over the first mesa and a ridge structure over the second mesa.

It is particularly advantageous if the third mask is formed from the same mask material as the first mask material. For example, in step g) the masks can be removed by a wet etch process, the first mask and third mask having a higher etch rate than the second mask.

BRIEF DESCRIPTION OF THE DRAWINGS

The invention will now be further described, by way of example only and with reference to the accompanying drawings, in which:

FIGS. 1A to 8A are plan views of some of the steps involved in the formation of a semiconductor device according to a preferred embodiment of the invention, having a buried heterojunction laser and a ridge waveguide electro-absorption modulator optically coupled to the output from the laser;

FIGS. 1B to 8B are respectively cross-sections through the electro-absorption portion of the semiconductor device depicted in FIGS. 1A to 8A; and FIGS. 2C to 8C are respectively cross-sections through the laser portion of the semiconductor device depicted in FIGS. 2A to 8A.

DETAILED DESCRIPTION

Figure 5A:
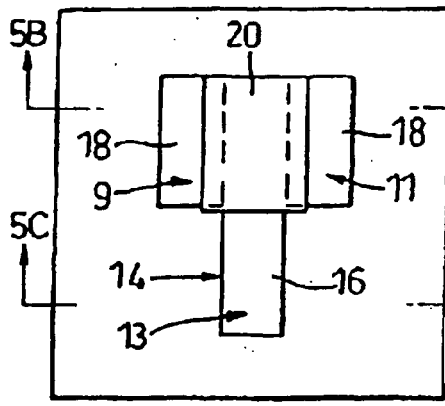

A semiconductor device according to an embodiment of the present invention can be fabricated on a wafer along with a plurality of other similar devices. Typically, a III–V semiconductor wafer is about 32 mm square on a side. FIGS. 1A and 1B are a plan view, not to scale, of a portion of such a wafer, having an n-InP substrate 2 doped to around $10^{19}/cm^3$, on which is grown a number of III–V semiconductor layers, using well-known MOCVD techniques. The p-type dopant can be zinc, and the n-type dopant can be sulphur.

The first grown layer is a 2 μm thick n⁻-InP buffer layer 8 doped to around $10^{18}/cm^3$. An active layer 10 is grown on the buffer layer 8 according to known techniques for fabricating planar active lasers for a laser diode or an electro-absorption device. The active layer could be a bulk region or a strained multiple quantum well (SMQW) structure; however, the type of active layer employed is not critical to the invention.

In the present example, the active layer is used to form a laser diode 1 depicted in the lower half of FIGS. 1A to 8A and in FIGS. 2C to 8C, as well as a ridge waveguide electro-absorption (EA) device 3 depicted in the upper half of FIGS. 1A to 8A and in FIGS. 1B to 8B.

The active layer 10 uses a quaternary $In_xGa_{1-x}As_{1-y}P_y$ structure that can be between about 100 nm to 300 nm thick. The active layer 10 is topped by a cladding layer 12, formed from $p^+$-InP, grown to be between about 100 nm to 1 $\mu$m thick.

Although not shown in the drawing figures, a DFB grating for the laser 1 can be contained in the n-InP buffer layer 8 or in the p-InP cladding layer 12.

Then, using well-known fabrication technology, the wafer is coated with two masking layers 16 and 18 (see FIGS. 2A to 2C). The first masking layer 16 can be $SiO_2$ deposited by a plasma enhanced chemical vapor deposition (PECVD) process. Immediately following deposition of the $SiO_2$ layer 16, a second masking layer 18 formed from silicon nitride is deposited on the first blocking layer 16.

Following the deposition of the silicon nitride, the second masking layer 18 is photolithographically patterned with a photoresist to leave a patterned mask (not shown), and etched to remove, in areas not covered by the patterned mask, the second masking layer 18, but not the first masking layer 16. The first masking layer 16 is therefore exposed in a first area 5, and the second masking layer 18 covers an adjacent second area 7.

As depicted in FIGS. 3A to 3C, the patterned surfaces of FIG. 2A are then again photolithographically patterned in a patterning process common to both the first area 5 and the second area 7, to remove both masking layers 16 and 18 except for a pair of spaced apart masks 9 and 11 in the second area 7 and a single mask 13 in the first area 5. Each of the masks 9 and 11 and 13 is elongated and rectangular, with the pair of masks 9 and 11 extending opposite and parallel to each other to define a gap 15 therebetween. The single mask 13 is also elongated and rectangular, and has a width equal to the width of the gap 15. The pair of masks 9 and 11 and the single mask 13 are arranged so the single mask 13 is in alignment with and abutting the gap 15 along a dividing edge 17 between the first and second areas 5 and 7. In the present example, the dimensions of each of the pair of masks are about 50 to 75 $\mu$m wide and 100 to 200 $\mu$m long, and the dimensions of the single mask are about 50 to 100 $\mu$m wide and about 300 to 400 $\mu$m long.

As depicted in FIGS. 4A to 4C, the wafer is again coated with an oxide and patterned so that a third masking layer 20, preferably formed from a similar $SiO_2$ material as the first oxide layer 16, is deposited, preferably through lift-off in combination with e-beam evaporation of $SiO_2$, to mask or cover the gap 15 and to overlap the adjacent pair of silicon nitride blocks 9 and 11. The third masking layer 20 abuts or slightly overlaps the single oxide mask 13 to fully cover the gap 15.

Figure 5B:
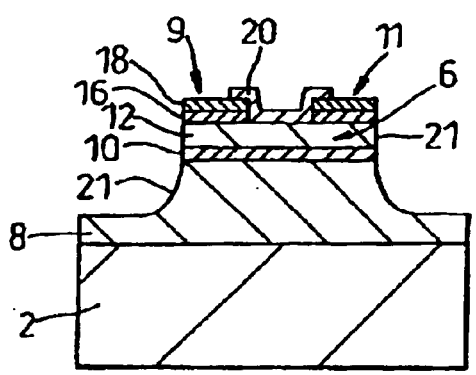
Figure 5C:
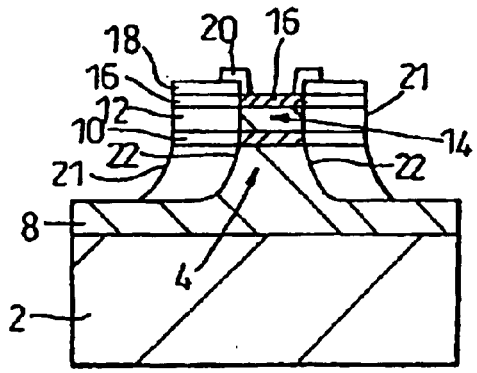

As depicted in FIGS. 5A to 5C, the capping layer 12, the active layer 10, and all but 200 nm of the buffer layer 8 are removed in a wet-etch process that results in concave side walls 21 and 22 that slope outwards beneath the outline of the silicon oxide and silicon nitride layers 16 and 18 and 20. The etching process forms a rectangular or square mesa structure 6 in the second area 7, (the mesa structure 6 being referred to hereinafter as the "waveguide mesa") that extends perpendicularly to the plane of the drawing in FIG. 5B, and which rises above the level of the substrate 2. At the same time, this etching process also forms an elongated mesa stripe 14 structure in the first area 5, (the stripe 14 being referred to hereinafter as the "laser mesa") that extends perpendicularly to the plane of the drawing in FIG. 5C, and which rises above the level of the substrate 2.

As depicted in FIG. 8C, the laser mesa 14 has left and right opposite side walls 22 that together with the buffer layer 8 and the cladding 12 form a current conduction region 4 for an applied current ($I_L$) 45, and have the effect of guiding an optical mode 25 along the active layer 10 within the laser mesa 14. The current conduction region 4 extends both above and below the active layer 10.

The width of the laser mesa 14 varies depending on the particular device, but for opto-electronic devices, such as laser diodes, the laser mesa 14 is usually between 1 $\mu$m and 10 $\mu$m wide. The laser mesa 14 rises 1 $\mu$m to 2 $\mu$m above the surrounding substrate 2.

Figure 6A:
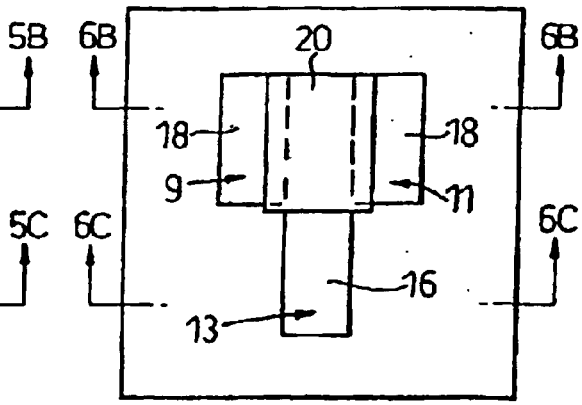
Figure 6B:
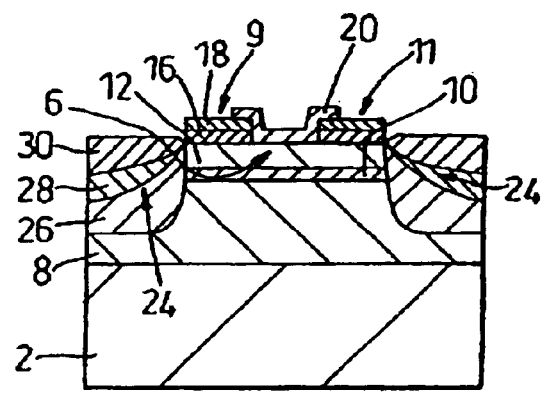
Figure 6C:
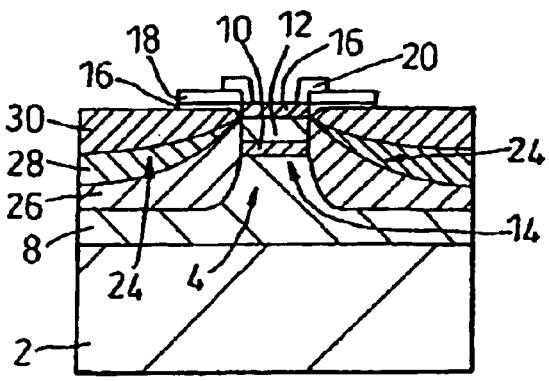

A current blocking structure 24 is then grown on the etched device up to approximately the level of the oxide and nitride layers 16 and 18 and 20, as depicted in FIGS. 6A to 6C. The current blocking structure 24 includes a first p-doped InP layer 26 having a dopant concentration of at least about $1 \times 10^{18}/cm^3$ and above this an n-doped InP layer 28 grown directly on the p-type layer 26. The n-doped InP layer 28 preferably has a substantially constant dopant concentration at least as high as the highest dopant concentration in the p-type layer 26. Finally a second p-doped InP layer 30 having a dopant concentration of at least about $1 \times 10^{18}/cm^3$ is grown directly on the n-type layer 28.

The thickness of the first p-doped layer is about 0.5 $\mu$m to 1 $\mu$m, the thickness of the n-doped layer is about 0.4 $\mu$m to 0.8 $\mu$m and the thickness of the second p-doped layer is about 0.5 $\mu$m to 1 $\mu$m. The InP layers 26,28 form a p-n junction that in use is reverse biased and hence insulating when the conduction region 4 is forward biased.

After deposition of the current blocking structure 24, the $SiO_x/SiN_x$ layers 16 and 18 and 20 are wet etched with an etchant that preferentially removes the exposed $SiO_x$ layers 16 and 20 as opposed to the silicon nitride layers 18. This again exposes the cladding layer 12 above both the laser mesa stripe 14 and the waveguide mesa 6.

An upper cladding layer 32 formed from $p^+$-InP is then grown above the exposed "lower" cladding layer 12 above the mesas 6 and 14 and above the current blocking structure 24 to a thickness of about 2 $\mu$m to 3 $\mu$m. The upper cladding layer 32 forms a uniform, flat layer in the first area 5, and forms a ridge 33 in the second area 7 that rises above the adjacent silicon nitride blocking layers 18. It has been found that the rate of growth of the upper cladding layer 32 above the lower cladding layer 12 is greater than the growth over the second p-doped InP layer 30, with the result that the ridge 33 rises above the level of the surrounding upper cladding layer 32.

The material of the waveguide ridge 33 and the portion of the semiconductor layers 8 and 10 directly beneath the ridge 33, form a waveguide current conduction region 40. Because the waveguide mesa side walls 21 are each separated from the ridge waveguide 33 by about 50 to 75 $\mu$m, essentially all the voltage ($V_M$) 47 supplied to drive the EA modulator 3 passes directly downwards into the substrate 2 with no significant voltage drop near the waveguide mesa side walls 21. The waveguide conduction region 40 therefore does not extend as far as the waveguide mesa sidewalls 21.

Optionally, a final 100 nm to 200 nm thick ternary cap layer (not shown) formed from $p^{++}$-GaInAs, highly doped to around $10^{19}/cm^3$, can be deposited on the cladding layer 32 to facilitate good ohmic contacts. As an alternative to a ternary cap layer, a quaternary InGaAsP cap layer, or both InGaAsP and InGaAs layers can be used.

Standard metal layers are then vacuum coated on the exposed uppermost semiconductor and silicon nitride layers 18 and 32. The metal coating is then photolithographically patterned using well-known techniques, to leave two contact pads 36 and 38, one above the laser mesa 14 and the other above the waveguide mesa 6.

Electrical current 45 and 47 can then be supplied via electrical connections (not shown) to the contact pads 36 and 38 to drive the laser device 1 or to modulate the EA waveguide device 3.

The resulting wafer is then thinned to a thickness of about 70 μm to 100 μm in a standard way, in order to assist with cleaving. Standard metal layers (not shown) are then deposited by sputtering on the rear surface of the wafer, enabling electrical contact to be made to the n-side of the devices.

The wafer is then inscribed and cleaved in a conventional process first transversely into bars about 600 to 700 μm wide, and then each bar is cleaved into individual devices 200 μm wide. The resulting cleaved device is about 600 to 700 μm long (in the direction of the laser mesa 14 and ridge waveguide 33) and about 200 μm wide.

Although not shown, after testing, the device 1 can be packaged in an industry standard package, with a single mode optical fiber coupled with a spherical lens to an output facet of the EA modulator 3, and with gold bond wires soldered onto the metallized contacts 36 and 38.

As can be appreciated from FIGS. 8A and 8B, the pair of spaced apart exposed silicon nitride masks 9 and 11 facilitates the formation of the device in a number of ways. First, in conjunction with the third mask 20, the pair of masks 9 and 11 results in the waveguide mesa 6 being sufficiently narrow so that electrical signal 47 supplied to the EA device 3 passes into the substrate 2 without diffusing laterally as far as the current blocking structure 24. The capacitance in the current blocking structure is therefore substantially isolated from the EA device 3. At the same time, the masks 9 and 11 act in the finished EA device 3 as current confining structures to provide good electrical resistance adjacent the ridge 33, and so help to confine the voltage drop 47 beneath the ridge 33.

The silicon nitride masks 9 and 11 also make it easier to deposit the electrical contact 38 for the EA device 3, because it is not necessary to align precisely the contact 38 with respect to the ridge 33. The contact 38 can therefore be sized somewhat wider than the ridge 33, with the excess width being deposited over the insulating masks 9 and 11.

An advantage of the present invention is that the laser mesa 6 is directly adjacent and self-aligned with respect to the ridge waveguide 33, because of the initial patterning of the oxide and nitride layers 16 and 18 as depicted in FIG. 3A. At the same time, the current confinement region 24 is separated from the ridge mesa 33 by the width of each of the silicon nitride blocks 9 and 11.

Because the laser device 1 and EA device 3 are integrated devices formed on a common substrate, the invention avoids the difficulty of having to align and join together two individual devices formed from different substrates.

Different current blocking structures are incorporated in InGaAsP/InP devices 1 and 3 described above. The layers used to form the laser current confinement region 24 adjacent the laser device 1 do not extend adjacent the ridge structure 33.

This allows each current blocking structure to be optimized according the requirements of each corresponding device 1 and 3. Therefore, the present invention provides a high resistivity current confinement region 24 adjacent the laser mesa 14, having low leakage currents across a wide range of operating temperatures, as well as a relatively low capacitance current blocking structure 9 and 11 adjacent the EA ridge waveguide 33. The present invention also permits the use of higher drive voltages in the ridge waveguide 33, which is useful in achieving high-speed operation.

Optionally, as depicted in FIG. 8A in dashed outline, a trench 50 can be etched in the upper cladding layer 32 between the ridge waveguide device 3 and laser device 1 in order to provide increased electrical isolation between the two devices 1 and 3. Although such a trench 50 can be formed in the semiconductor layers 12 and 32 that lie above the active layer 10, the trench should not extend through to the active layer itself.

Semiconductor devices according to the present invention provide a high operating bandwidth and good lifetime characteristics. The process steps involved can be similar to other standard steps used in the fabrication of such devices. There is no need for additional expensive processing equipment.

The present invention is therefore particularly useful for a buried heterostructure laser diode combined with an electro-absorption modulator suitable for use as a transmitter in a high-speed fiber-optic link operating at 10 Gbits/s or more at a wavelength between 1.27 and 1.6 μm.

Although the present invention has been described specifically for the example of a laser diode and an electro-absorption modulator, the present invention is applicable to any integrated opto-electronic semiconductor devices where different current blocking regions are needed to help channel current to different components. Examples include ridge waveguide lasers, pump lasers, edge emitting light emitting diodes, surface emitting lasers and light emitting diodes. Another example is an optical waveguide that is split into two waveguides at a Y-junction. This can have electrically driven or modulated active optical regions in two or three of the arms of the "Y", for example, an optical amplifier or modulator. It can desirable to provide a current blocking region at the junction of the three arms, where there can be three separate conduction regions.

The present invention has been described above for a device based on an n-InP substrate, having a first current blocking structure formed from a reverse biased p-n junction in laterally adjacent contact with the active layer structure. However, it is to be appreciated that the present invention can also be applied to other types of devices, for example, those based on a p-InP substrate. In this case, the first current blocking layer would be formed from an n-type material.

What is claimed is:

1. A semiconductor device including a semiconductor substrate and a plurality of semiconductor layers grown over the substrate, comprising:

at least one active layer located within one of the plurality of semiconductor layers, said at least one active layer including a plurality of integrated optical components, said integrated optical components including a buried heterojunction laser and a ridge waveguide having an optically guiding ridge structure, the ridge waveguide being optically coupled via said at least one active layer to laser radiation generated by a laser; and a laser current conduction region located above the active layer and a laser current confinement region located adjacent the active layer of the laser, the laser current conduction region and laser current confinement region being arranged to channel electric current to the at least one active layer of said laser;

wherein said ridge structure comprises one or more layers also used to form the laser current conduction region; and wherein the layers comprising the laser current confinement region do not extend adjacent the ridge structure.

2. The semiconductor device as claimed in claim 1, wherein said ridge waveguide comprises an opto-electronic modulator arranged to modulate the optical radiation generated by said laser.

3. The semiconductor device as claimed in claim 1, wherein the layers that form said laser current conduction region also form a waveguide current conduction region arranged to channel electric current to said at least one active layer of said ridge waveguide.

4. The semiconductor device as claimed in claim 2, wherein said buried heterojunction laser comprises a first buried mesa flanked by said laser current confinement region, and wherein said ridge structure rises above a second mesa flanked by the same semiconductor layers forming said laser current confinement region, said second mesa having a plateau separating said ridge structure from said same semiconductor layers.

5. The semiconductor device as claimed in claim 4, wherein said plateau of the second mesa is covered with an insulating layer extending from said same semiconductor layers forming said laser current confinement region to said ridge structure.

6. The semiconductor device as claimed in claim 5, wherein an electrical contact layer overlays said ridge structure, said electrical contact layer extending over sides of said ridge structure and partially over said insulating layer covering said plateau.

7. The semiconductor device as claimed in claim 1, further comprising a trench located between said ridge waveguide and said laser, said trench being formed in semiconductor layers lying above said at least one active layer, but not through said at least one active layer.

8. The semiconductor device as claimed in claim 1, wherein said laser current confinement region comprises at least one reverse biased p-n junction or n-p junction.

9. A method of forming a semiconductor device, comprising:
   depositing a plurality of semiconductor layers including an active layer over a semiconductor substrate over to form a plurality of integrated optical components, the integrated optical components including a buried heterojunction laser and a ridge waveguide, the ridge waveguide being optically coupled via the active layer to receive laser radiation generated by the laser;
   manufacturing the laser and ridge waveguide from the semiconductor layers by:
   i) forming at least one active layer;
   ii) forming a laser current conduction region that extends above the at least one active layer;
   iii) forming a laser current confinement region adjacent the active layer of the laser, the laser current conduction region and laser current confinement region being arranged to channel electric current to the active layer of the laser; and
   iv) forming an optically guiding ridge structure comprising one or more of the semiconductor layers that also form the laser current conduction region;
   wherein the laser current confinement region does not extend adjacent the ridge structure.

10. The method as claimed in claim 9, wherein the laser conduction region and the ridge structure comprise at least one common semiconductor layer.

11. The method as claimed in claim 9, wherein step i) comprises forming a first mesa in the buried heterojunction laser component and step iv) comprises forming a second mesa structure in the ridge waveguide, the mesa structures being formed by a concurrent deposition of a plurality of semiconductor layers common to both the heterojunction laser and the ridge waveguide, followed by a concurrent etching of the common semiconductor layers to form the mesas.

12. The method as claimed in claim 11, wherein following the forming of the mesas, step iii) comprises depositing a plurality of semiconductor layers adjacent both mesas to form the laser current confinement region, the deposited layers being common to both the heterojunction laser and the ridge waveguide.

13. The method as claimed in claim 12, comprising the steps of:
   a) depositing the plurality of semiconductor layers including the at least one active layer on the substrate;
   b) depositing a first mask material over a first area of the semiconductor layers deposited in step a) and depositing a second mask material over a second area of the semiconductor layers deposited in step a);
   c) patterning both the first mask material and the second mask material in a patterning process common to both the first area and the second area to create a first mask in the first area and a second mask in the second area, the first mask comprising a block of the first mask material, and the second mask comprising a pair of blocks of the second mask material, the pair of blocks of the second mask material defining an unmasked gap therebetween and the unmasked gap being in alignment with and adjacent to the block of the first mask material;
   d) covering the gap between the pair of blocks of the second mask material with a third mask;
   e) etching the deposited semiconductor layers around a periphery of the first mask, second mask, and third mask to create a first mesa under the first mask and a second mesa under the second and third masks;
   f) depositing a plurality of semiconductor layers adjacent the first mesa and the second mesa to form the laser current confinement region;
   g) removing the first and third masks; and
   h) depositing one or more semiconductor layers over the exposed areas of the mesas apart from the area of the second mesa covered by the second mask to form the laser current conduction region over the first mesa and the ridge structure over the second mesa.

14. The method as claimed in claim 13, wherein the third mask is formed from the same mask material as the first mask.

15. The method as claimed in claim 13, wherein the masks are removed by a wet etch process in step g), the material of the first mask and third mask having a higher etch rate in the process than the material of the second mask.

16. The method as claimed in claim 13, wherein at least one electric contact layer is deposited over the semiconductor layers deposited in step h), at least one of the electrical contact layers providing an electrical contact arranged to supply an electrical signal to the ridge structure, the at least one electrical contact layer extending over the ridge structure and partially overlapping the second mask.

17. The method as claimed in claim 9, further comprising forming a trench between the ridge waveguide and heterojunction laser to partially isolate the heterojunction laser from the ridge waveguide, the trench being formed in the semiconductor layers lying above the at least one active layer but not through the at least one active layer.

* * * * *